United States Patent
Cheong et al.

(10) Patent No.: US 10,925,189 B2
(45) Date of Patent: Feb. 16, 2021

(54) SYSTEM OF HEATED AIR STAGING CHAMBER FOR SERVER CLUSTER OF DATA CENTER

(71) Applicant: ERS GX HOLDING PTE LTD, Singapore (SG)

(72) Inventors: Chun Keat Cheong, Singapore (SG); Kheng Hock Lee, Singapore (SG); Chong Meng Goh, Singapore (SG); Azrin Sahroon Bin Mohd amin, Skudai (MY)

(73) Assignee: ERS GX HOLDING PTE LTD, Singapore (SG)

( * ) Notice: Subject to any disclaimer, the term of this patent is extended or adjusted under 35 U.S.C. 154(b) by 0 days.

(21) Appl. No.: 16/283,193

(22) Filed: Feb. 22, 2019

(65) Prior Publication Data
US 2020/0008323 A1  Jan. 2, 2020

(30) Foreign Application Priority Data
Jun. 29, 2018  (SG) .......................... 10201805667X

(51) Int. Cl.
*H05K 7/20* (2006.01)
(52) U.S. Cl.
CPC ......... *H05K 7/20827* (2013.01); *H05K 7/202* (2013.01); *H05K 7/2029* (2013.01); *H05K 7/20136* (2013.01); *H05K 7/20736* (2013.01); *H05K 7/20745* (2013.01); *H05K 7/20754* (2013.01); *H05K 7/20818* (2013.01); *H05K 7/20836* (2013.01)

(58) Field of Classification Search
CPC .......... H05K 7/20818; H05K 7/20136; H05K 7/202; H05K 7/2029; H05K 7/20736; H05K 7/20754; H05K 7/20836; H05K 7/20145; H05K 7/20554–20572; G06F 1/206
USPC ...... 361/688–696, 679.46–679.51, 724–727; 165/104.22, 205, 208–209, 212–214; 417/36; 415/206
See application file for complete search history.

(56) References Cited

U.S. PATENT DOCUMENTS

| | | | | |
|---|---|---|---|---|
| 6,128,186 A | * | 10/2000 | Feierbach | G06F 1/1613 312/223.3 |
| 7,259,963 B2 | * | 8/2007 | Germagian | H05K 7/20745 361/690 |
| 9,690,337 B1 | * | 6/2017 | Eichelberg | H05K 7/20709 |
| 2009/0014397 A1 | | 1/2009 | Moss et al. | |
| 2010/0110633 A1 | * | 5/2010 | Gigushinsky | H05K 7/20736 361/695 |
| 2014/0206271 A1 | * | 7/2014 | Ignacio | H05K 7/20736 454/184 |

(Continued)

FOREIGN PATENT DOCUMENTS

GB  2518659  *  9/2013  ............... H05K 7/20

*Primary Examiner* — Zachery Pape
*Assistant Examiner* — Amir A Jalali
(74) *Attorney, Agent, or Firm* — Hamre, Schumann, Mueller & Larson, P.C.

(57) ABSTRACT

Embodiments herein relate generally to a system to efficiently remove heat generated by equipment/server racks of data center, wherein a chamber is provided to contain, channel, and diffuse the heat or heated air to a heat removal cabinet, thereby a cooling can take place, furthermore the amount of cooling is configurable by altering angle of diffusion.

14 Claims, 15 Drawing Sheets

(56) References Cited

U.S. PATENT DOCUMENTS

| | | | | |
|---|---|---|---|---|
| 2014/0290193 A1* | 10/2014 | Wang | ............... | H05K 7/20181 |
| | | | | 55/313 |
| 2016/0215999 A1* | 7/2016 | Bard | ............... | H05K 7/20181 |
| 2016/0353612 A1* | 12/2016 | Lee | ............... | H05K 7/208 |
| 2017/0181325 A1* | 6/2017 | Shelnutt | ............ | H05K 7/20272 |
| 2018/0077819 A1* | 3/2018 | Roy | ............... | H05K 7/20745 |
| 2018/0110154 A1* | 4/2018 | Mayer | ............... | H05K 7/20572 |

\* cited by examiner

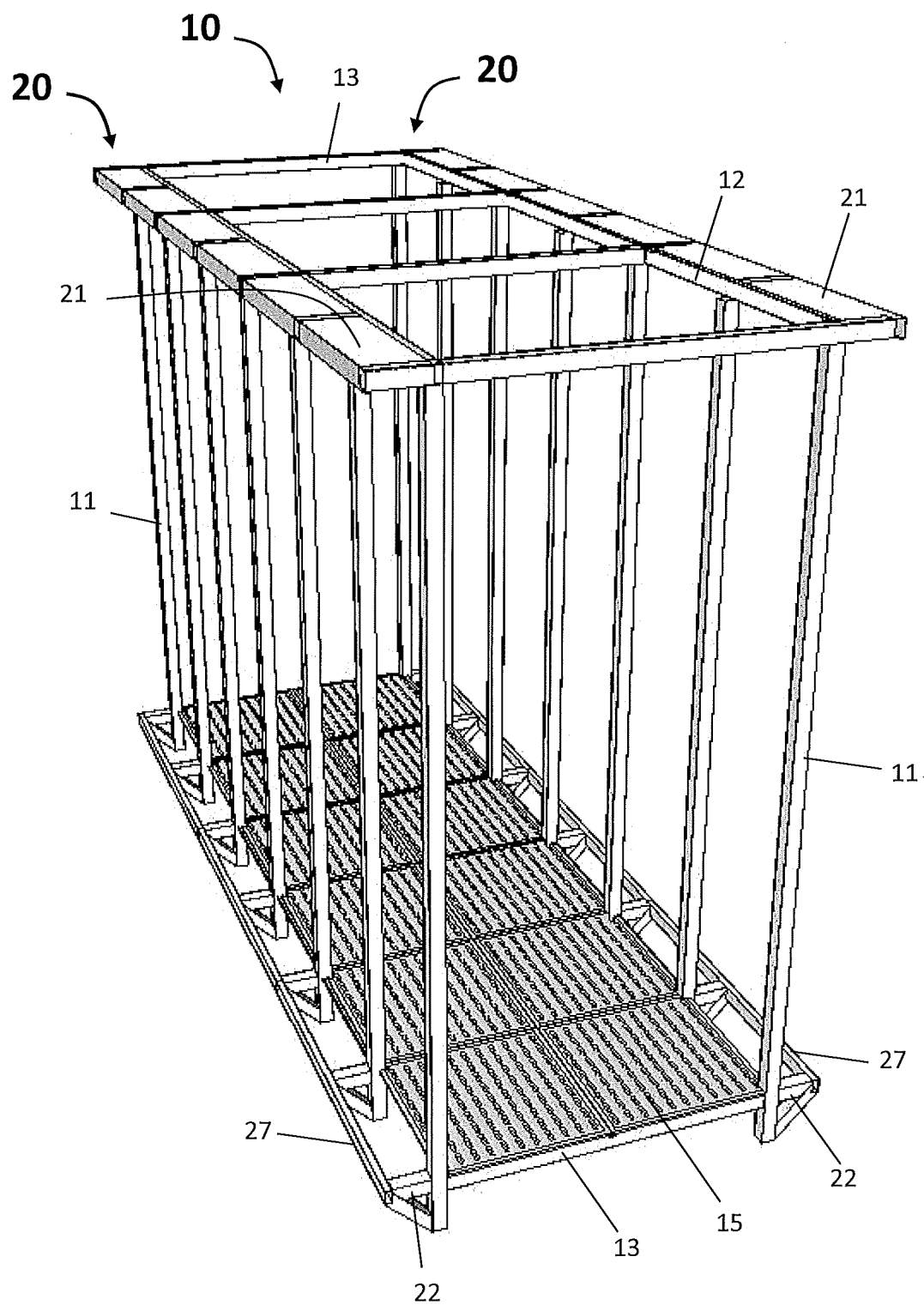
FIG. 1-A

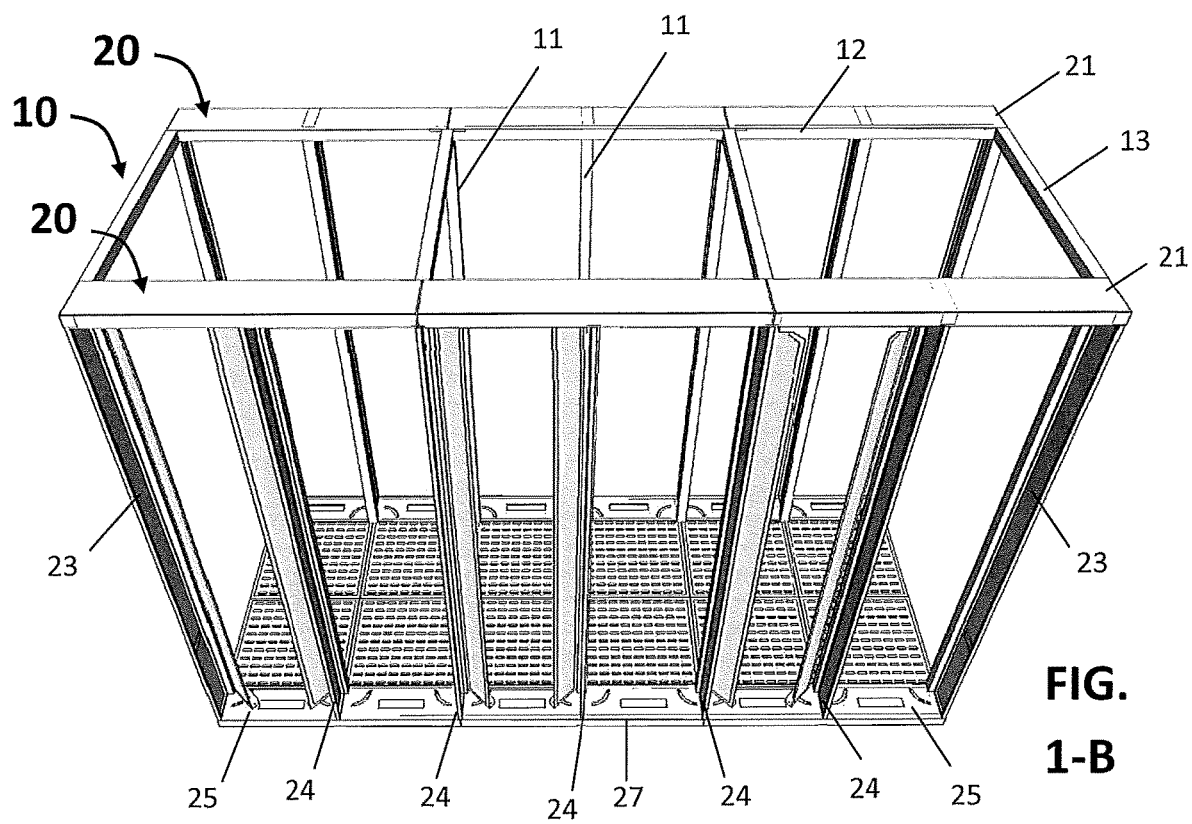
FIG. 1-B
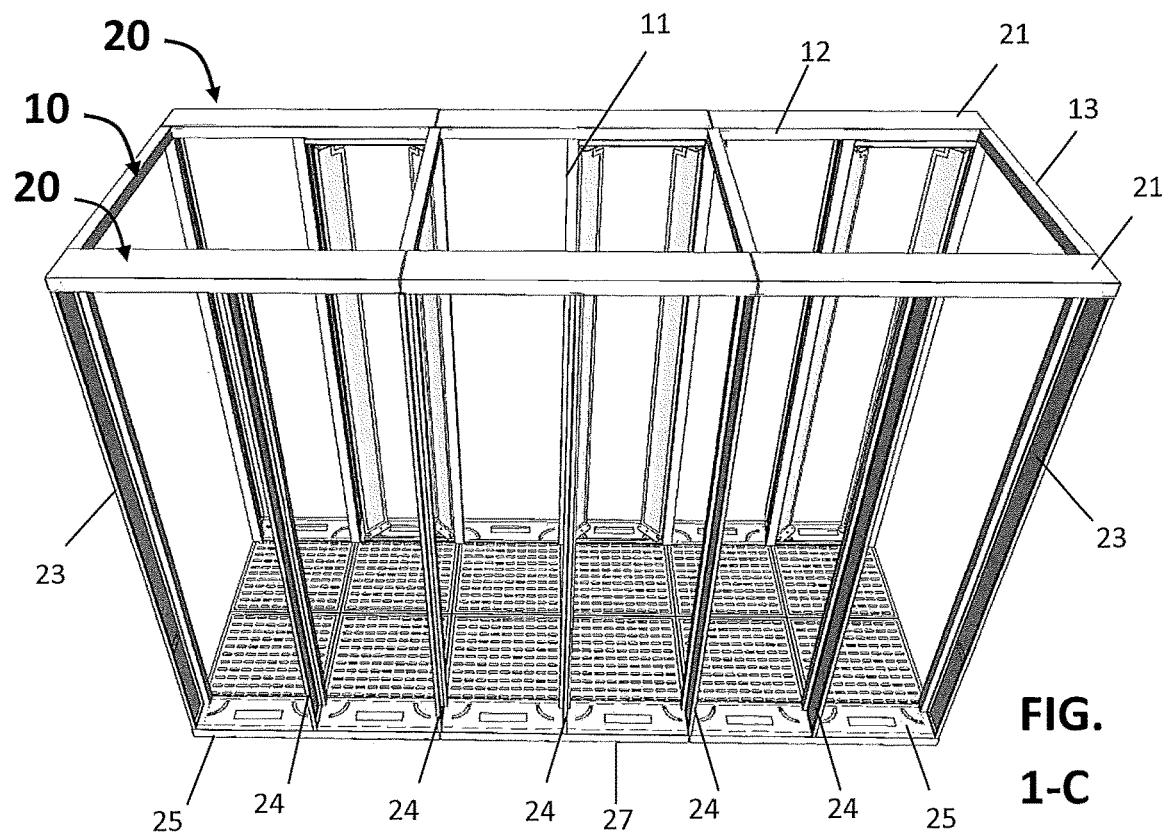
FIG. 1-C

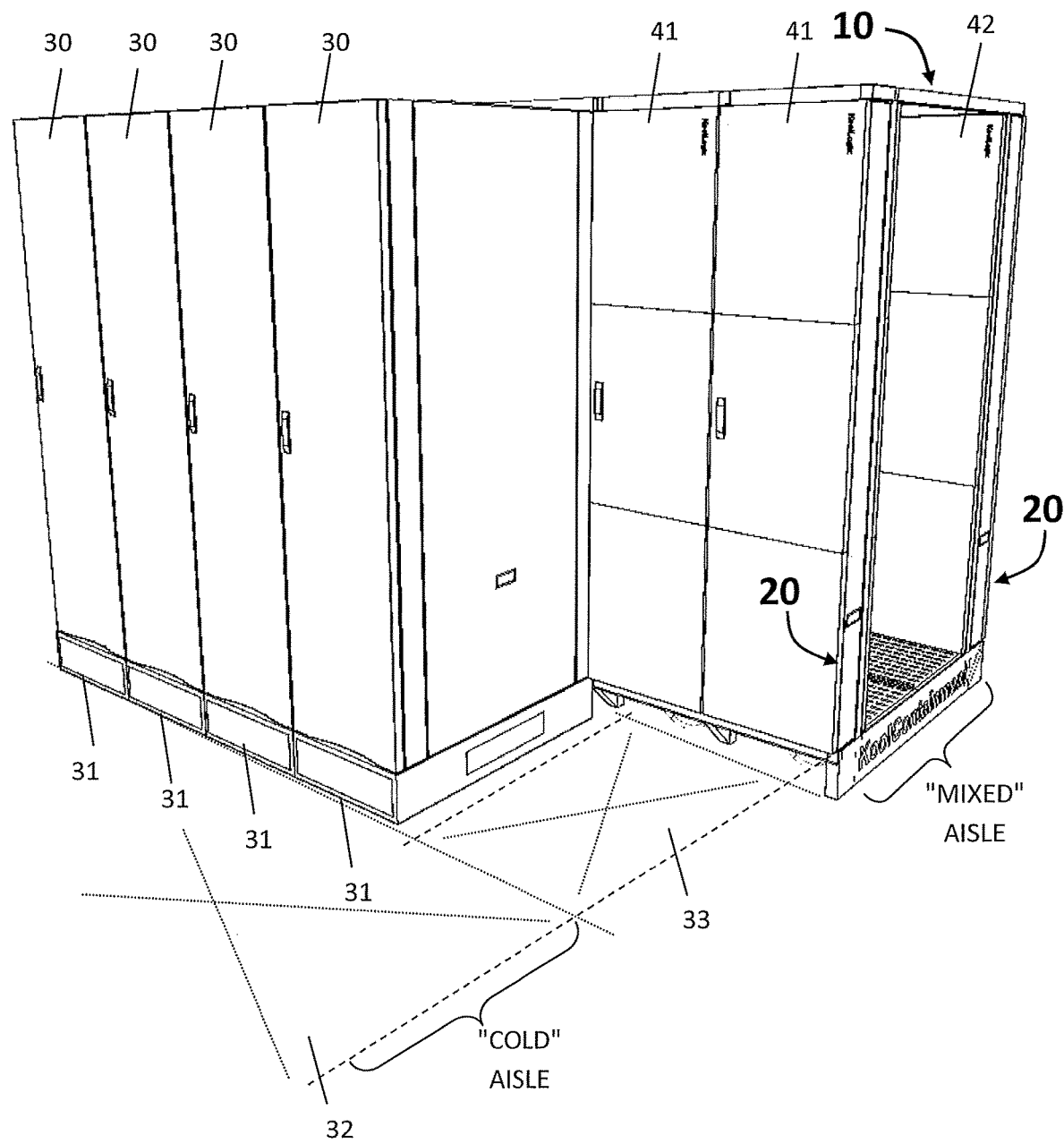
FIG. 2-A

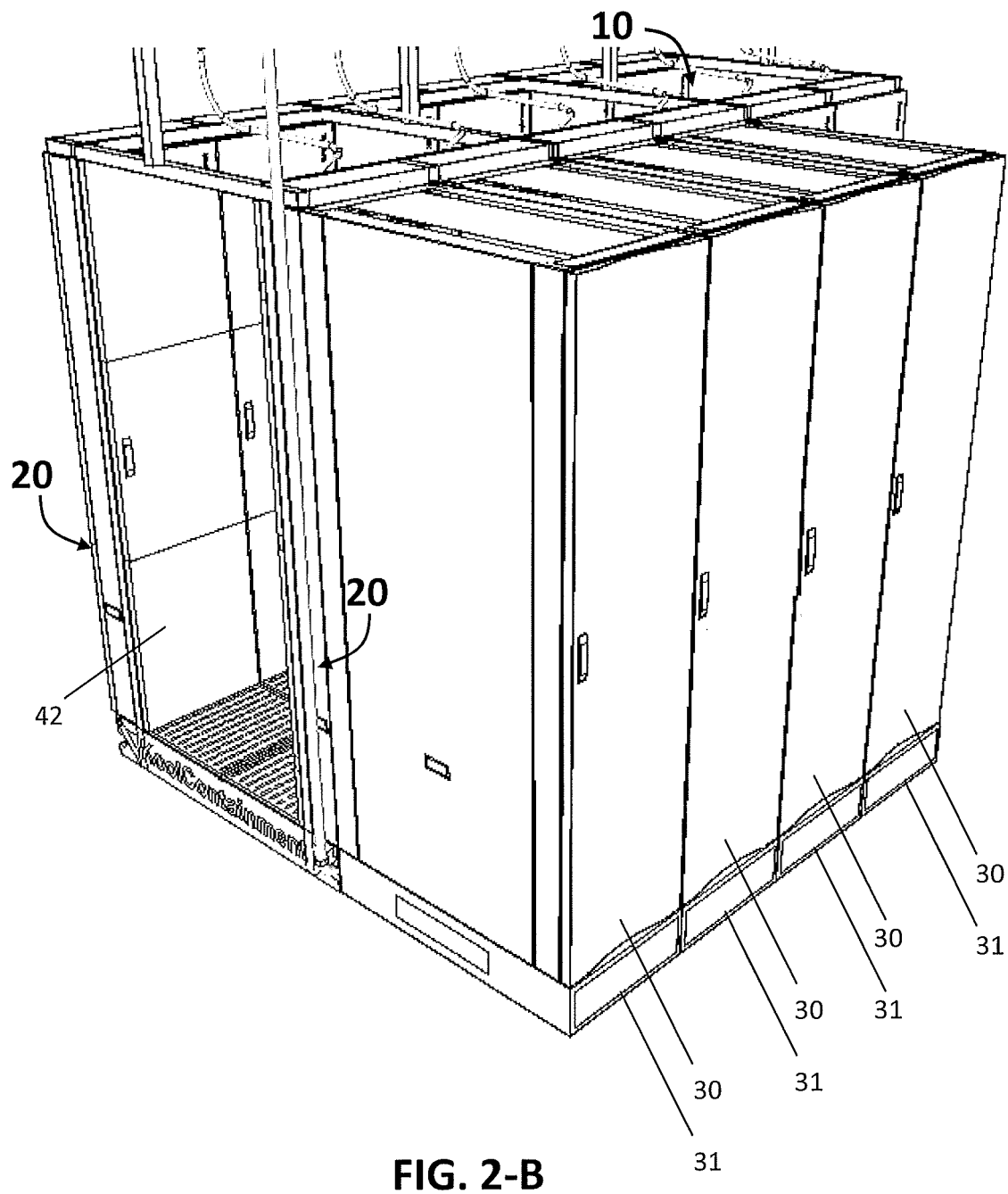
FIG. 2-B

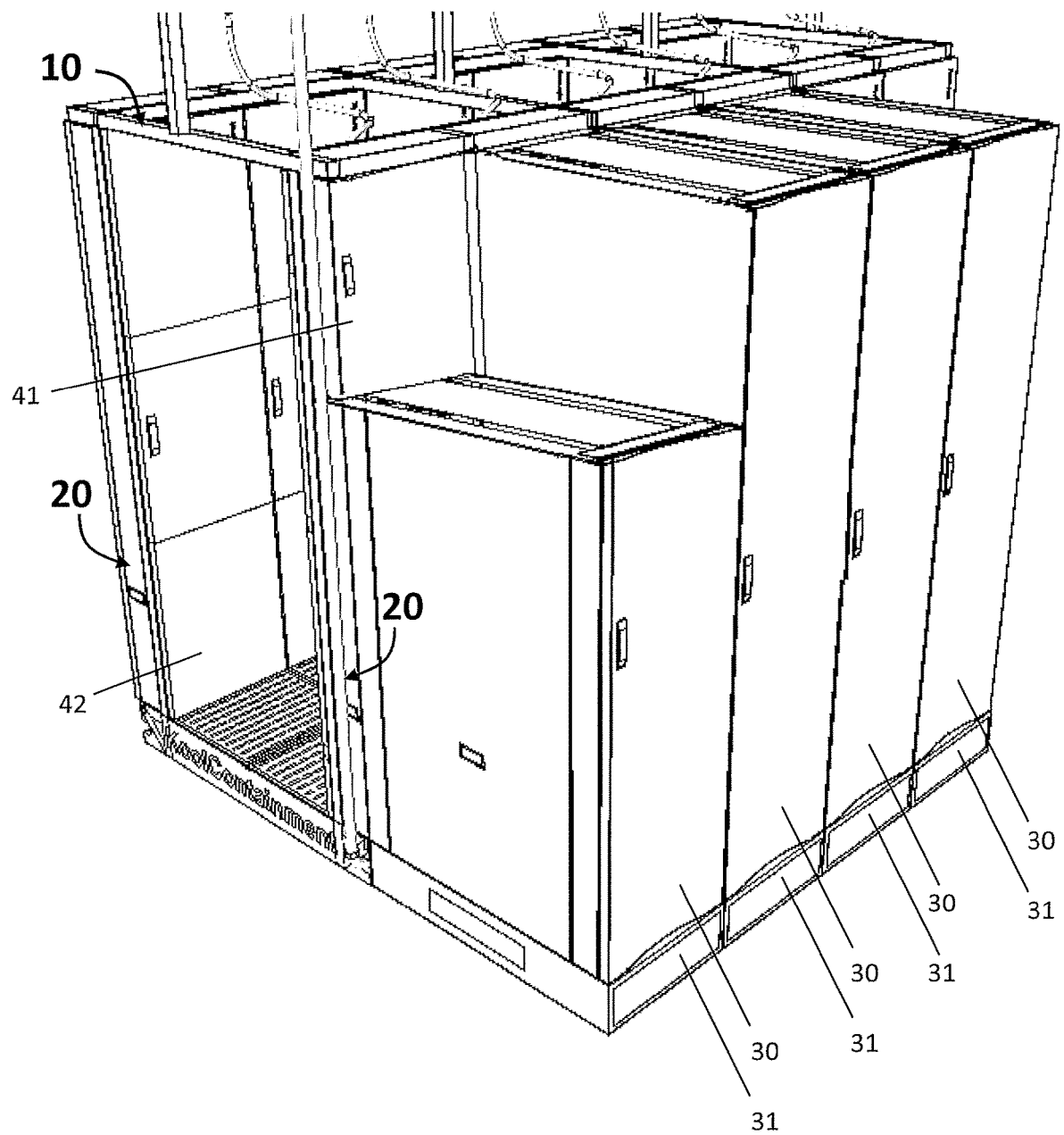
FIG. 2-C

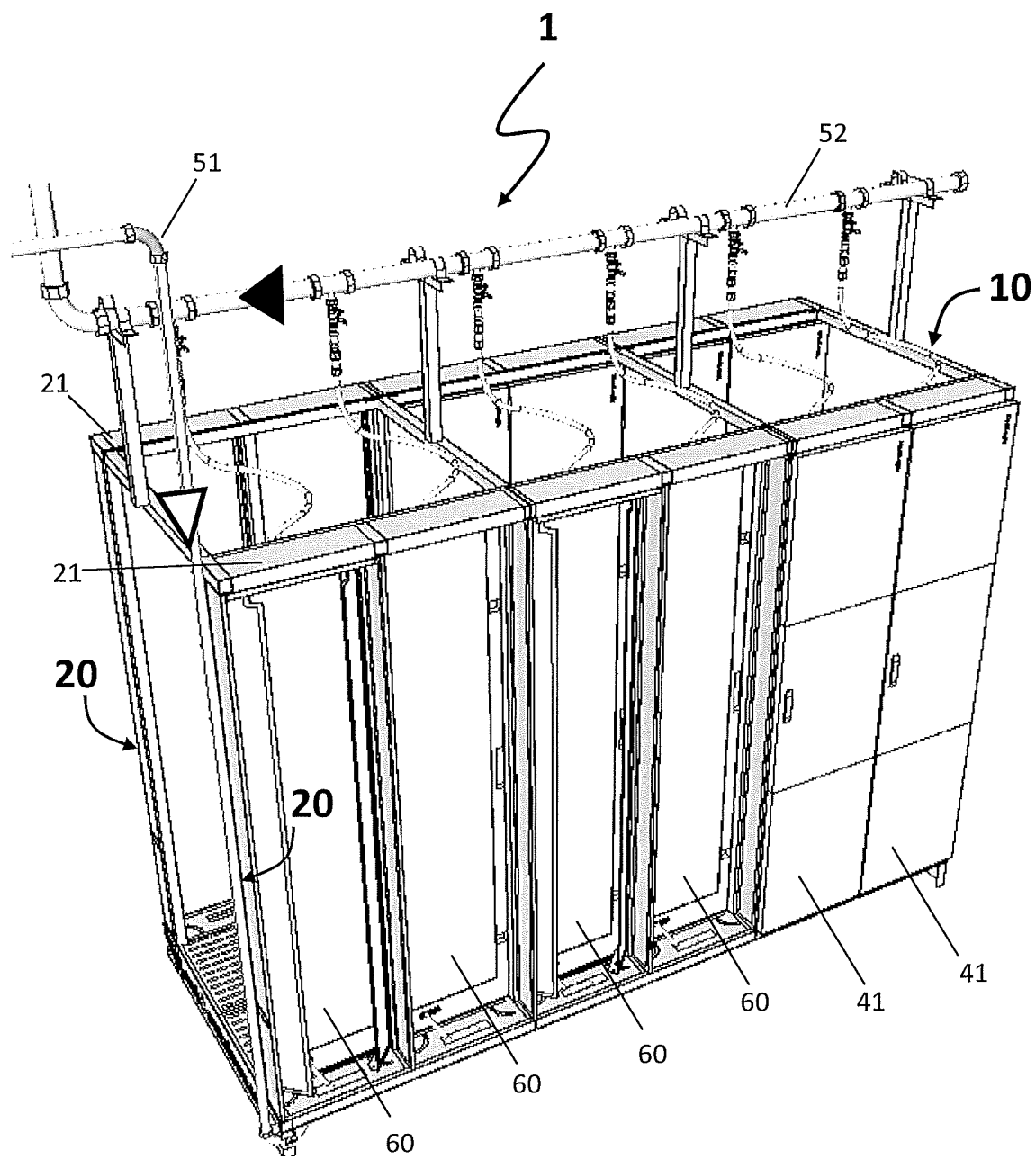
FIG. 3-A

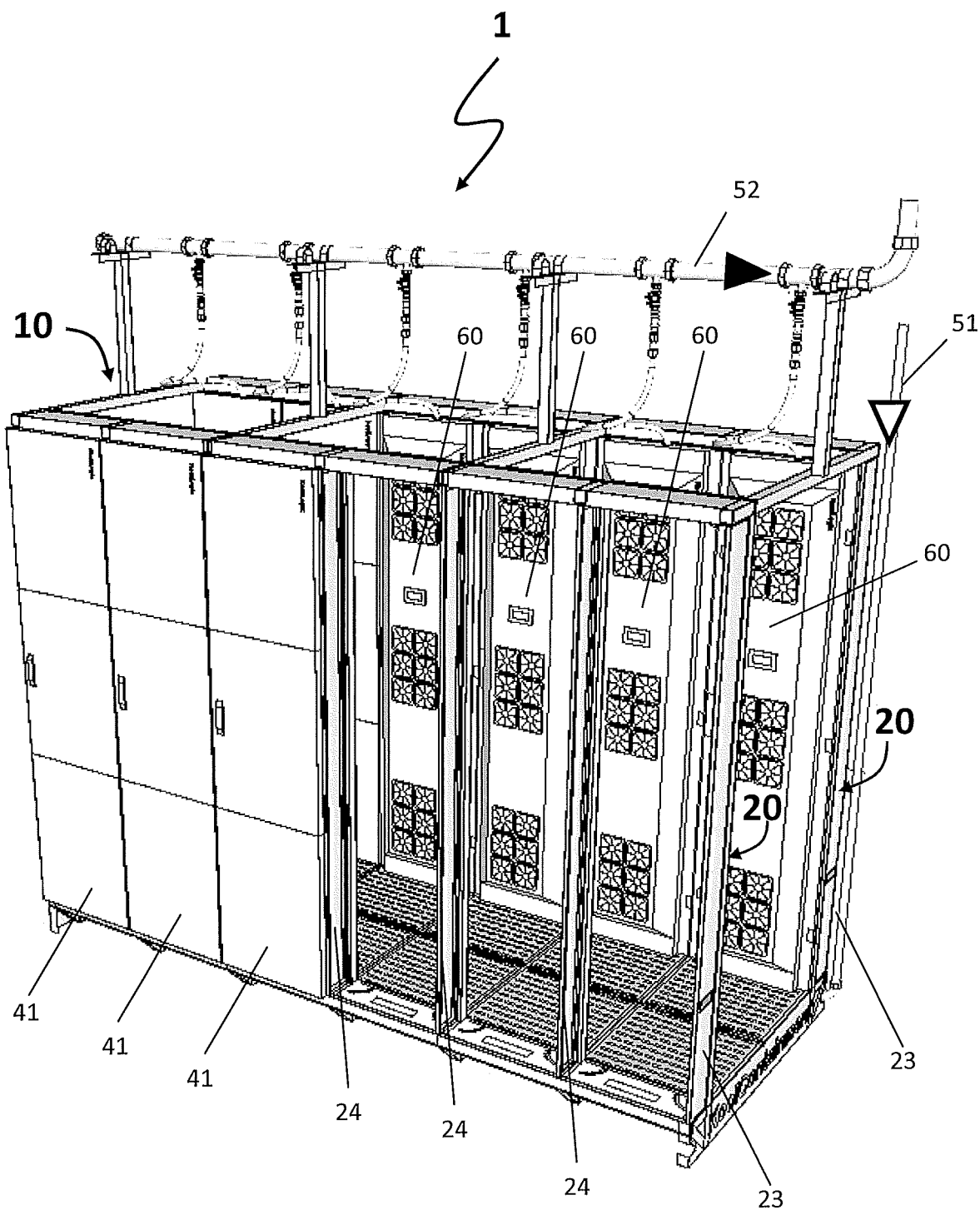
FIG. 3-B

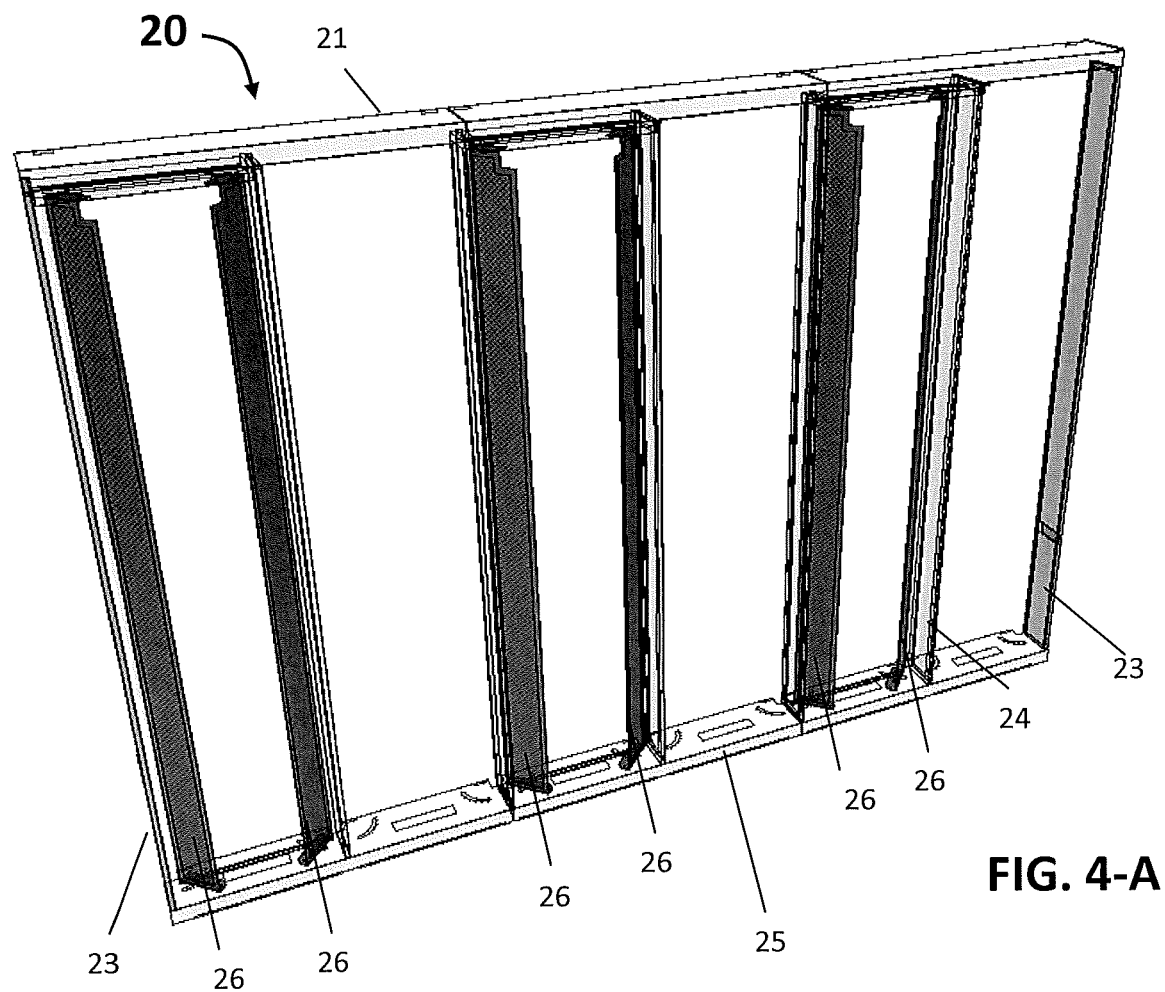
FIG. 4-A

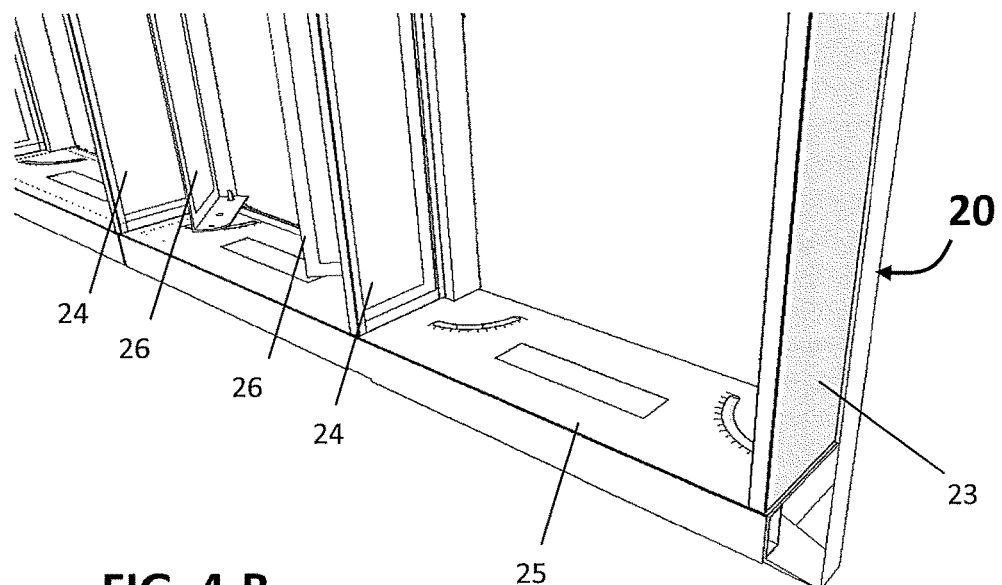
FIG. 4-B
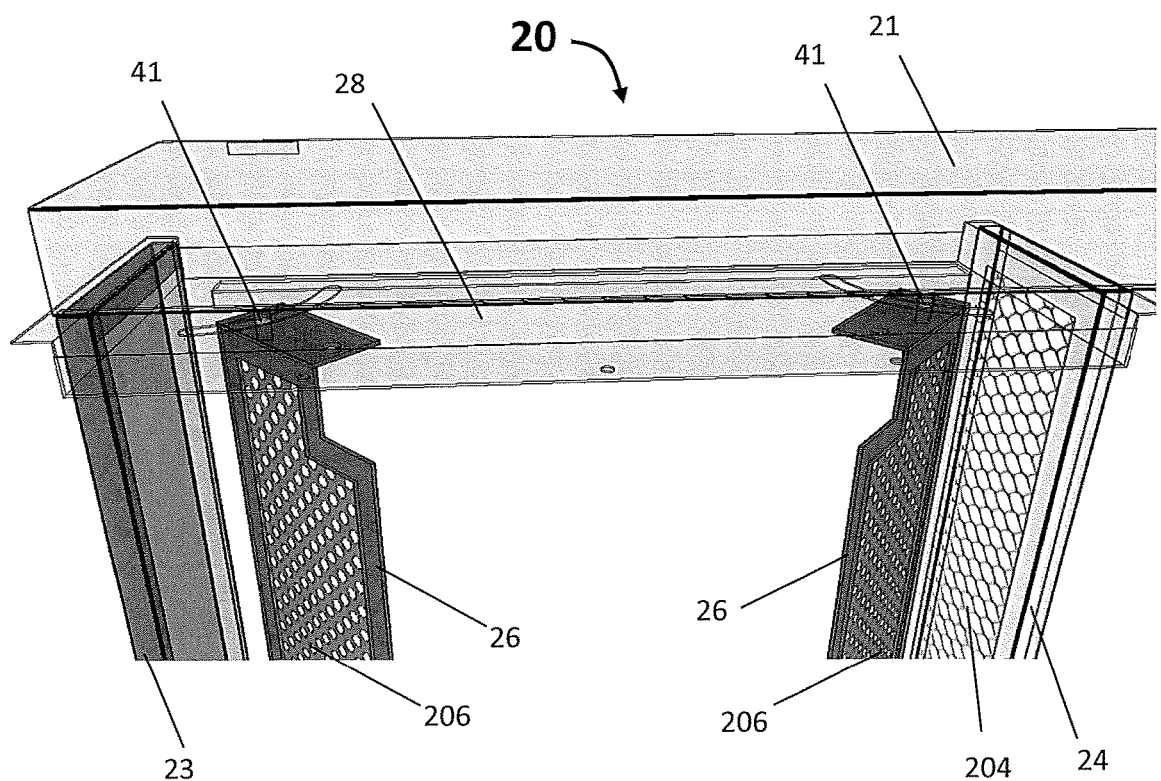
FIG. 4-C

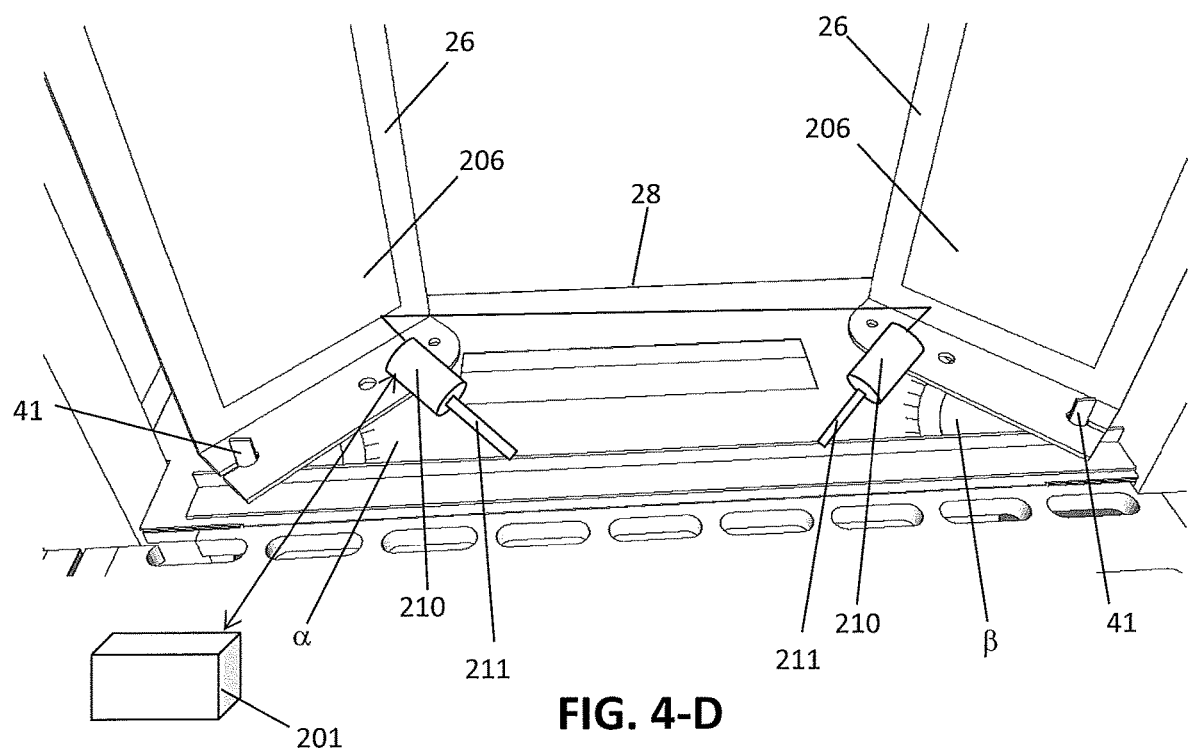
FIG. 4-D

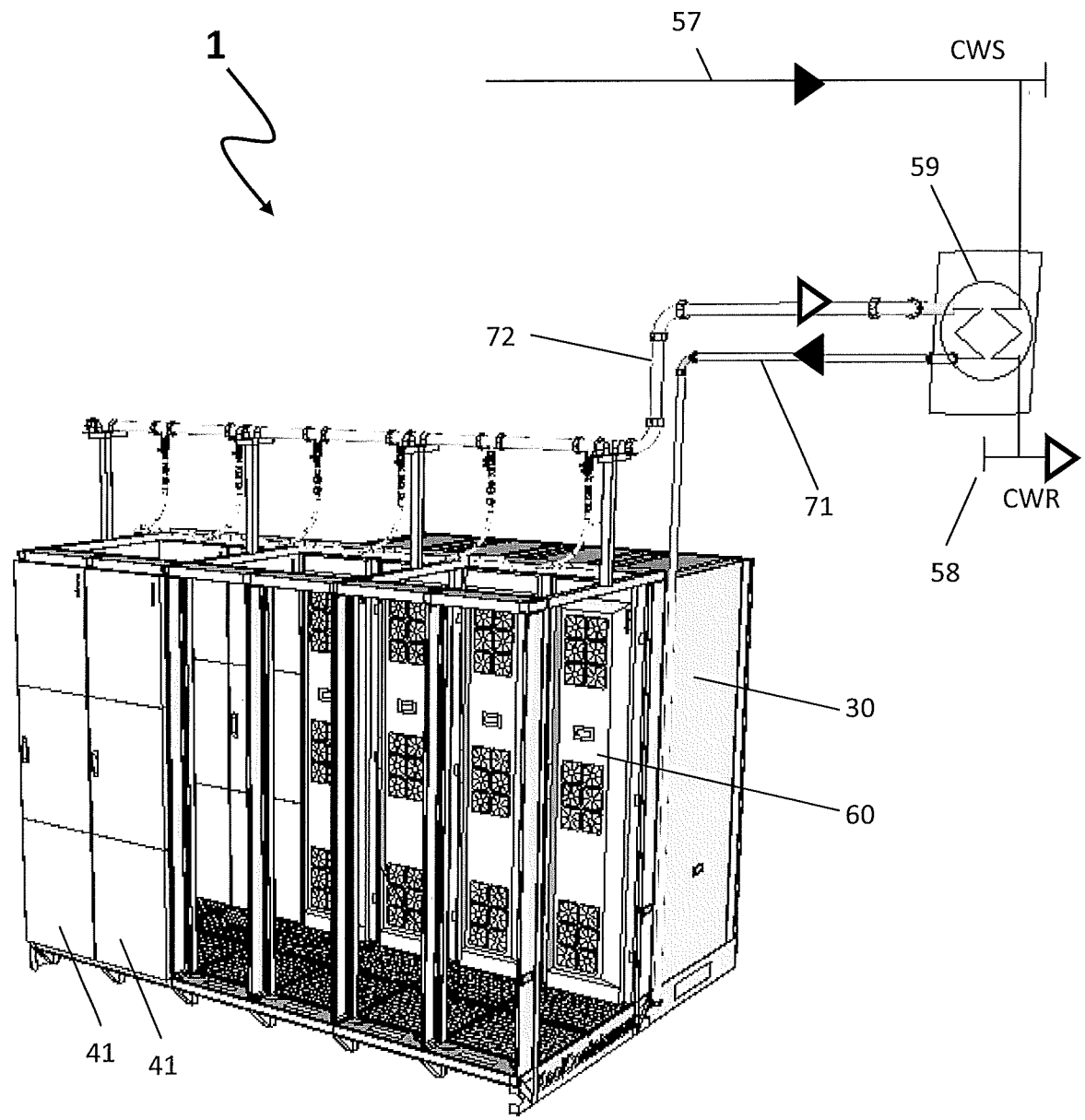
FIG. 5-A

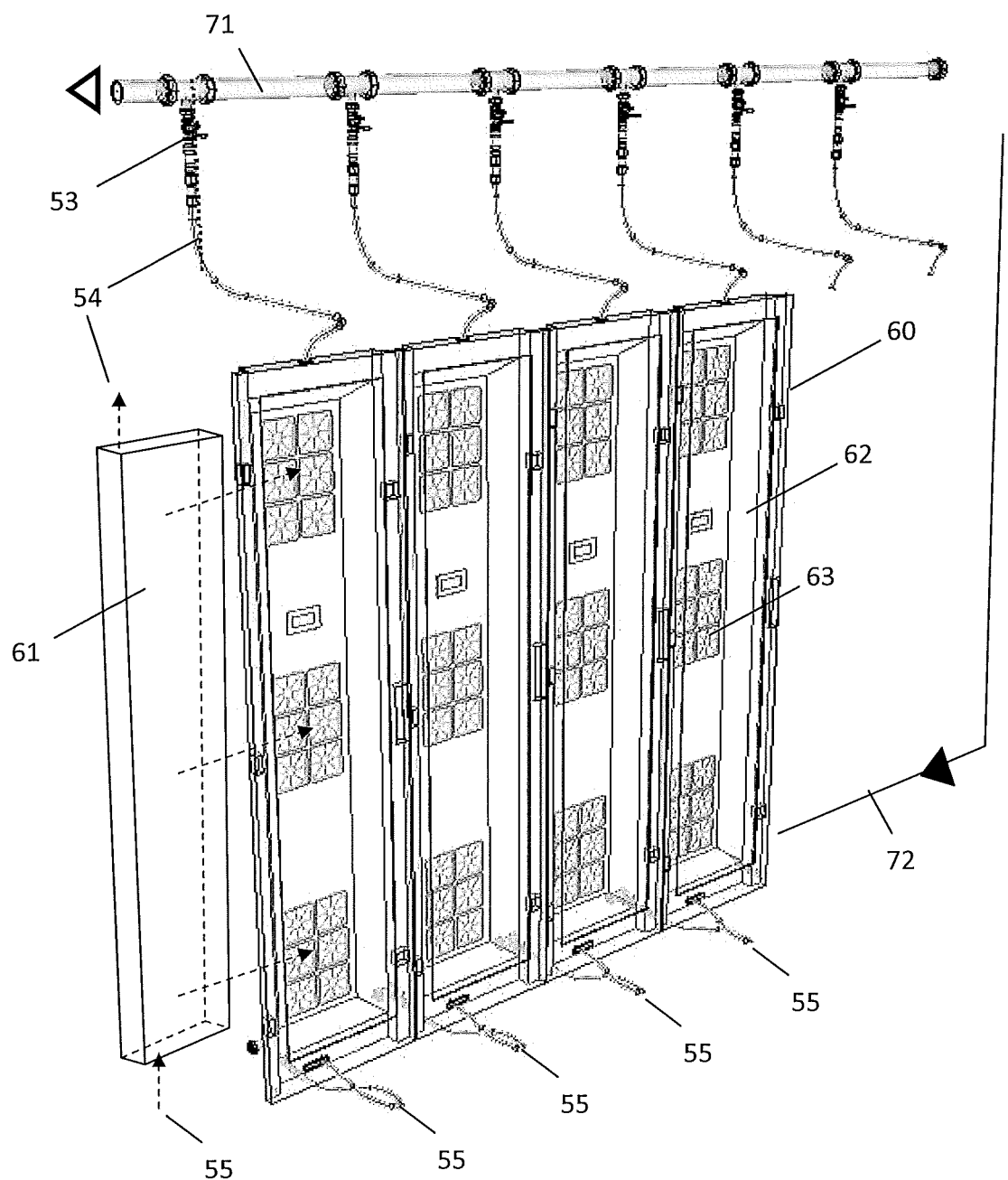
FIG. 5-B

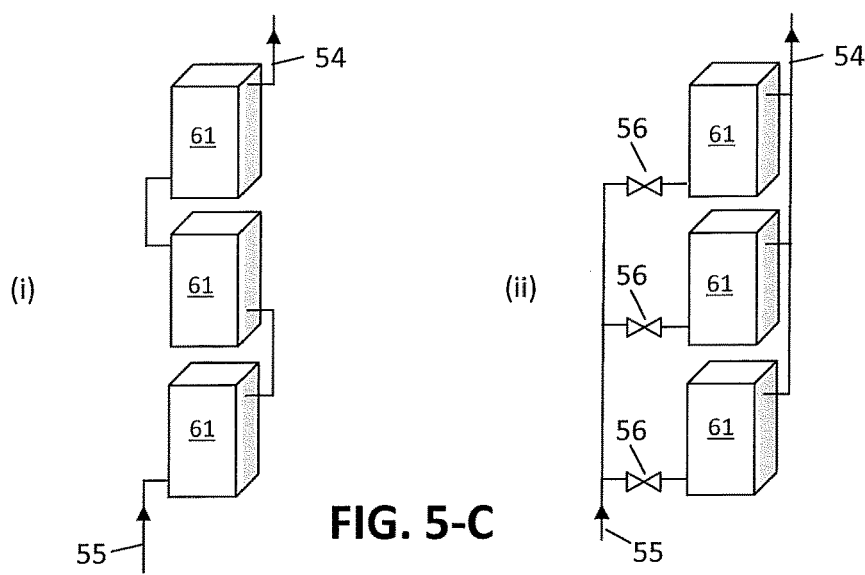
FIG. 5-C
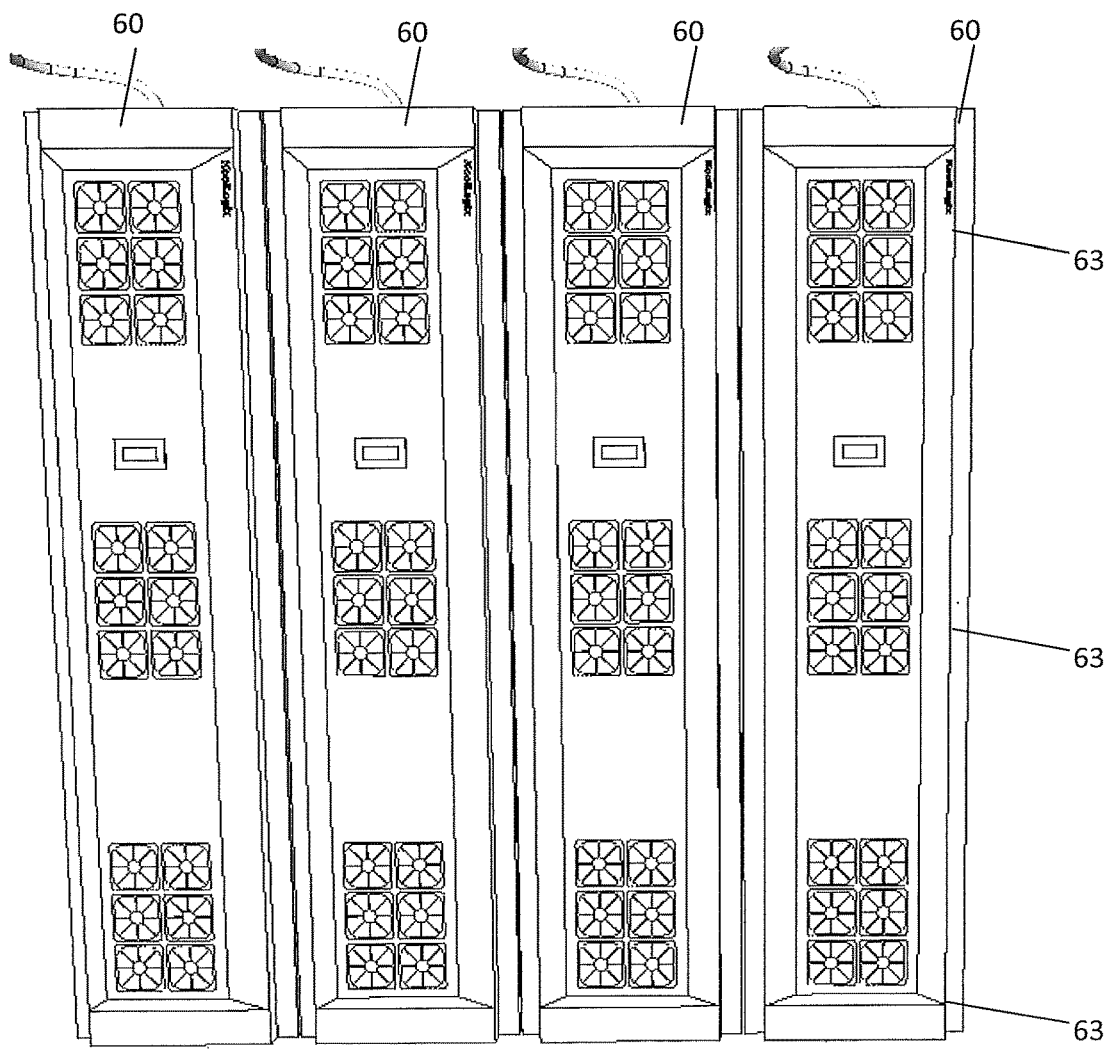
FIG. 5-D

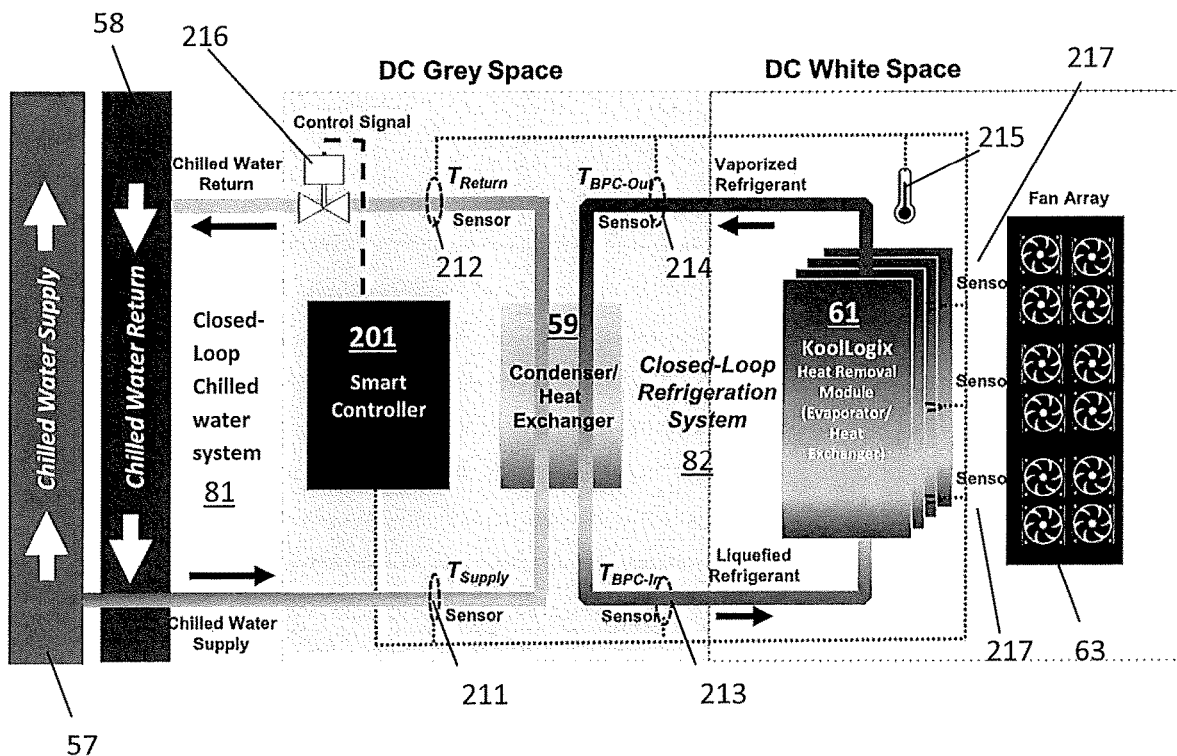
FIG. 5-E
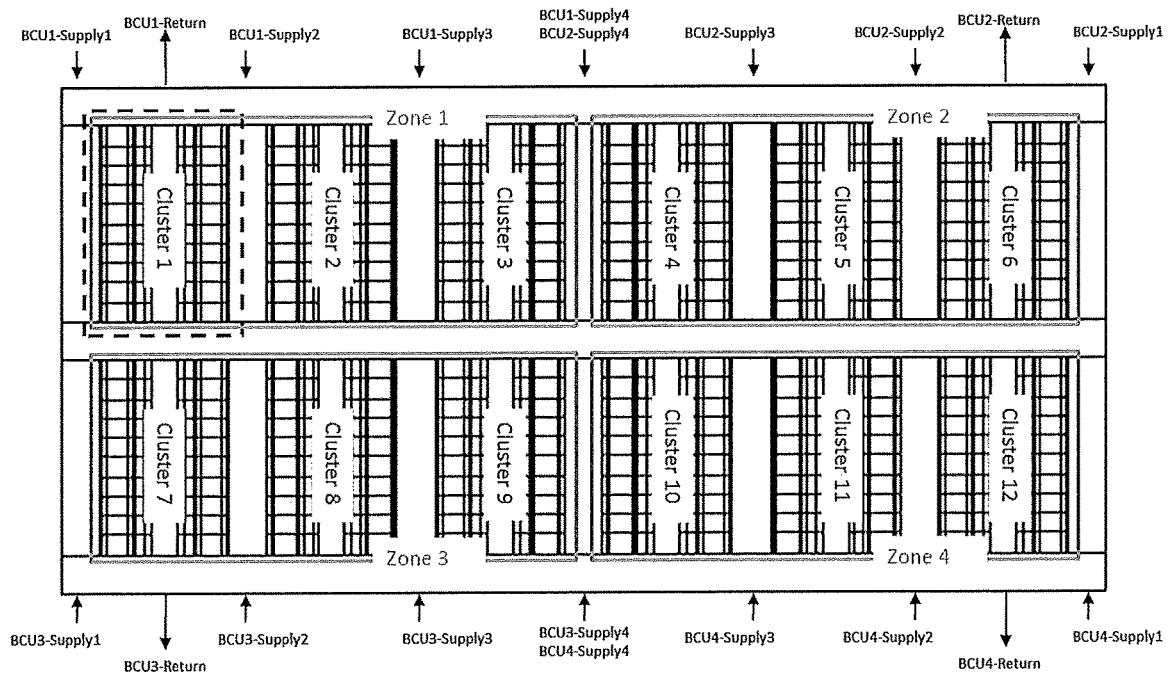
FIG. 6-A

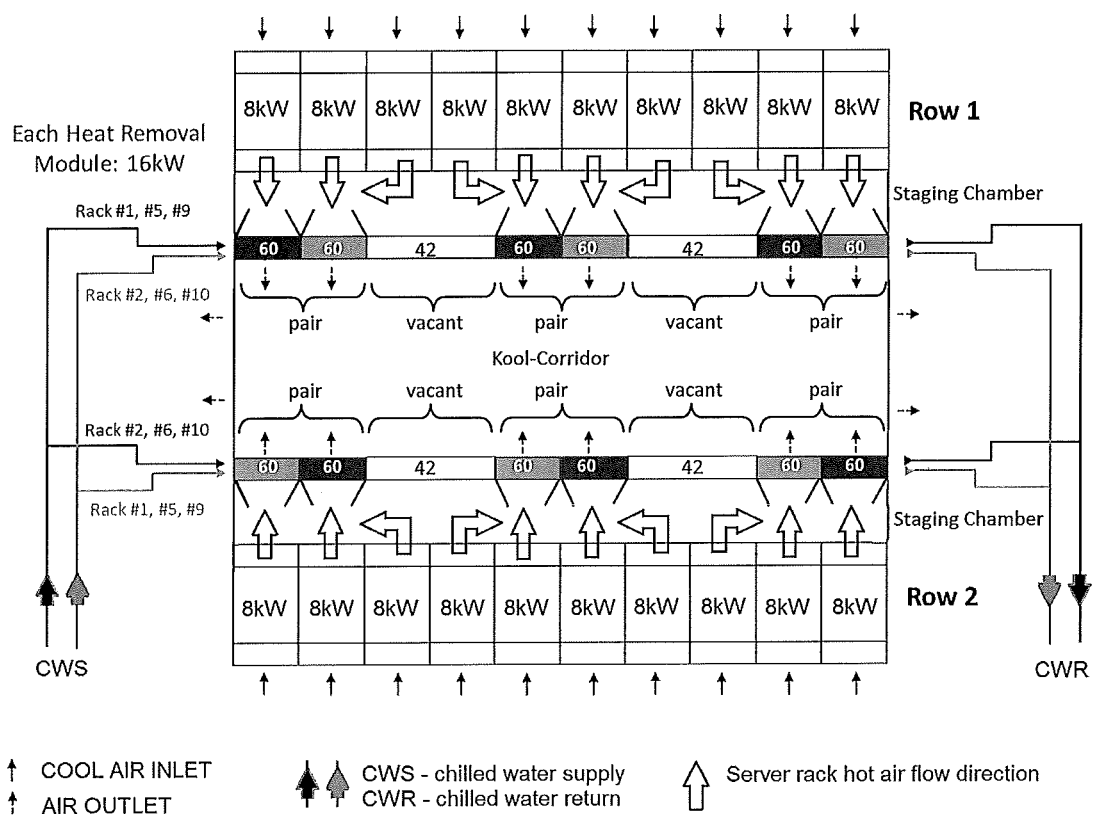
FIG. 6-B

SYSTEM OF HEATED AIR STAGING CHAMBER FOR SERVER CLUSTER OF DATA CENTER

TECHNICAL FIELD OF THE INVENTION

Embodiments of the present invention herein generally relate to a system to effectively and efficiently remove heat generated by equipment/server racks of data center, wherein a chamber is provided to contain, channel, and diffuse the heated air or exhaust to a heat removal cabinet, so that a cooling can take place, furthermore the amount of cooling is configurable by altering angle of diffusion.

BACKGROUND OF THE INVENTION

Data center utilizing air thermal separation technique coined as a cold/hot aisle or server enclosure is well known. US 2009/0014397A1 to Moss and Hoss premises on a type of server/equipment rack heat removal by placing the back of each of the racks adjacent to one another, thereby forming a relatively narrow space between each of the back of the racks. The hot air is then channeled to a containment where cooling of the hot air is carried out. However, there are shortcomings on such teachings, i.e., due to the racks are back-to-back and in a relatively narrow manner, the server rack fan may have to work extra to push the hot air upward as opposed to the present invention whereby the heat removal cabinet is adapted and configured adjacent to the heat source.

SUMMARY OF THE INVENTION

Accordingly, a chamber is provided to allow heated air generated from the server racks in a cluster to be mixed, channelled, and diffused prior to a heat removal cabinet.

Accordingly, the chamber effectively and efficiently conveys heated air to the corresponding heat removal cabinet so that cooling capacity of the cabinet can be maximized.

Accordingly, the chamber provides a plurality partitions enabling heat removal cabinets to be fitted; unused or empty partitions can be sealed by inner and outer enclosures. Further, to provide redundancy in cooling capacity, the chamber is configured so that additional heat removal cabinets can be fitted.

Accordingly, angle of diffusion can be configured manually or automatically to allow a predetermined heated air to be cooled by the heat removal cabinets.

Additional objects of the invention will become apparent with an understanding of the following detailed description of the invention or upon employment of the invention in actual practice.

According to the preferred embodiment of the present invention the following is provided:

A system for heat removal from server racks, comprising:

a mixing chamber of a substantially rectangular frame, defined by a first major surface configured to attach or removably attach on a server frame, wherein the first major surface receiving heat generated from the server racks, a second major surface configured to attach or removably attach on at least one heat removal cabinet, wherein the second major surface expelling the heat to the heat removal cabinet; impermeable top, bottom and lateral surfaces disposed adjacent to the major surfaces forming an enclosure of the chamber;

characterized in that the first major surface comprising a plurality of partition assembly configured to width and height of communicating server racks or outer enclosures; and the second major surface comprising a plurality of partition assembly configured to width and height of communicating heat removal cabinet or inner enclosure.

BRIEF DESCRIPTION OF THE DRAWINGS

Other aspect of the present invention and their advantages will be discerned after studying the Detailed Description in conjunction with the accompanying drawings in which:

FIG. 1-A shows a perspective view of a preferred embodiment server cluster frame and a pair of hot air staging chambers or mixing chamber.

FIG. 1-B shows a view of a preferred embodiment server cluster frame comprising a hot air staging chamber with dividers installed.

FIG. 1-C shows a view of a preferred embodiment server cluster frame comprising a hot air staging chamber with dividers installed.

FIG. 2-A shows an exemplary of an arrangement of server racks coupled to the server cluster frame individual partition. Partitions that are not in use are sealed with an outer and inner enclosure.

FIG. 2-B shows another view of FIG. 2-A showing the installation of the inner enclosure.

FIG. 2-C shows another embodiment of server rack and outer enclosure.

FIG. 3-A shows the arrangement of server racks removed, exposing a preferred embodiment heat removal cabinets with cabinet heat-side receiving heated air generated from the server racks, this preferred cabinet has liquid/air heat exchanger therein.

FIG. 3-B shows another view of FIG. 3-A of the heat removal cabinet with cabinet fan-side.

FIG. 4-A shows a preferred embodiment heated air mixing chamber coupled with impermeable top, lateral and bottom sides, partition assembly and diffusers.

FIG. 4-B shows an enlarged view of bottom portion of the preferred embodiment heated air mixing chamber.

FIG. 4-C shows an enlarged view of top portion of the preferred embodiment heated air mixing chamber.

FIG. 4-D shows a preferred embodiment of actuator to configure angle of diffusion of the diffuser.

FIG. 5-A shows a top perspective view of the present invention with the mixing chamber omitted.

FIG. 5-B shows a preferred embodiment heat removal cabinets heat receiving side.

FIG. 5-C shows an exemplary heat exchanger inside the heat removal cabinet connection, (i) serially and (ii) parallel.

FIG. 5-D shows the preferred embodiment heat removal cabinets fan-side.

FIG. 5-E shows a schematic diagram of a preferred embodiment heat exchanger interconnected by a chilled water/refrigerant heat exchange systems coupled with controllers or computers, control valves, sensors, thermometers, or the like.

FIG. 6-A shows an exemplary data center arrangement comprising zones of server clusters and backup cooling unit.

FIG. 6-B shows an exemplary of a server cluster running at 100% capacity and heat removal cabinets running at 100% cooling capacity.

DETAILED DESCRIPTION OF THE DRAWINGS

In the following detailed description, numerous specific details are set forth in order to provide a thorough understanding of the invention. However, it will be understood by the person having ordinary skill in the art that the invention may be practised without these specific details. In other instances, well known methods, procedures and/or components have not been described in detail so as not to obscure the invention.

The invention is not limited in its application to the construction and arrangement of equipment, instrument, or ancillary components set forth in the following description or illustrated in the drawings. Although a preferred embodiment and best mode are described, the claims are not limited as such, rather scope of the claims are defined and structured to include the preferred embodiment and best mode. The terminology used such as "including", "comprising", "containing", "having", or other variations should not regarded as limiting; it is meant to encompass the items listed and equivalents thereof as well as additional items by a skilled artisan.

The invention will be more clearly understood from the following description of the embodiments thereof, given by way of example only with reference to the accompanying drawings, which are not drawn to scale.

Referring to FIG. 1-A, there is shown a perspective view of a preferred embodiment server cluster frame (10) flanked by a pair of hot air staging chambers or mixing chambers (20). The server cluster frame (10) generally comprising an arrangement of vertical frames (11), width frames (12), and depth frames (13) so that a server rack can be coupled on. A web surface (15) can be mounted on the depth frames (13) serves as a walk way corridor. Here shown this embodiment of the mixing chamber (20) which is contiguous with the server cluster frame (10), generally comprising top surface (21) preferably impermeable, extends from the topmost width frame; depth frame (22) extends from low region of the vertical frame (11) forming a depth perspective, a width frame (27) then coupled with the depth frames (22) forming a width perspective or foundation. It is also envisaged that another embodiment of the chamber (20) can be removably attached to the server cluster frame (10).

Referring now to FIG. 1-B, there is shown a view of a preferred embodiment server cluster frame comprising a hot air staging chamber or mixing chamber with dividers or partition assemblies (24) installed. In FIG. 1-C shows another view of a preferred embodiment server cluster frame comprising a hot air staging chamber or mixing chamber with dividers or partition assemblies (24) installed. A server rack (not shown) can be coupled on each of the partition. A bottom surface (25) disposed on the foundation of the chamber formed between the depth frame (hidden) and width frame (27), the bottom surface may employ an impermeable material thereby limiting air leakages therein. Also it is envisaged that lateral top and side surfaces (21, 23) employ impermeable material. Hence it is defined that a first major surface comprising a plurality of partition assembly (24) can be configured to width and height of communicating server racks (30) or outer enclosures (41); and a second major surface comprising a plurality of partition assembly (24) can be configured to width and height of communicating heat removal cabinet (60) or inner enclosure (42). The partition assembly (24) has web structure (204) thereon, enabling heated air therethrough so that volume of the heated air is mixed homogenously and temperature of the heated air in the chamber approaches equilibrium. Further, the partition assembly (24) can be coupled with an air diffusing means comprising at least one diffuser (26) mounted substantially vertical between guide plates (28).

Referring to FIG. 2-A, there is shown an exemplary of an arrangement of uniform sized server racks (30) disposed on a rack pallet (31) may comprising rollers allowing mobility, the racks (30) can be moved and coupled to each individual partition of the chamber (20) which coupled to the server cluster frame (10). Partitions that are not in used are sealed with an outer (41) and inner enclosure (42), also to keep the mixing chamber (20) sealed. Between the two chambers (20) or interior of the server cluster frame (10) is the walk way or corridor can be regarded as "mixed" aisle. Inside the "mixed" aisle, the heated air which ejected from the server racks is cooled down by heat removal cabinet, the air temperature inside the "mixed" aisle can be warmer or about the ambient air temperature. The exterior part of the chambers (20) can be regarded as "cold" aisle whereby cold air can be defined as having ambient air temperature, or cold air can be supplied by computer room air conditioning unit (CRAC) or the cold air can be supplied underneath a raise floor (32) which served as a cold air plenum, then the cold air travels through a perforated/grilled floor tile (33) to the server racks (30). Referring now to FIG. 2-B, there is shown another view of FIG. 2-A showing the installation of the inner enclosure (42). Referring now to FIG. 2-C, there is shown another embodiment of a small server rack (30), outer enclosure (41) can be configured to seal any exposed area of the chamber (20).

In FIG. 3-A shows an exemplary embodiment system (1) for heat removal from server racks. Here the arrangement of server racks are removed, exposing a heat removal cabinet (60) with cabinet heat side receiving heated air generated from the server racks, this embodiment of heat removal cabinet (60) has water/air heat exchanger therein which coupled to a chilled water supply (51) and chilled water return (52). Although in this embodiment, the heat removal cabinet (60) relies on heat transfer between heated air and chilled water; in following part of the description, a preferred embodiment of heat removal cabinet (60) is further explained. Partitions not coupled with server racks are covered or sealed by outer enclosure (41) and inner enclosure (42). In FIG. 3-B shows another view of FIG. 3-A of the heat removal cabinets (60) with cabinet fan-side. In this embodiment of heat removal cabinet (60) receives chilled water/liquid supply (51) demarcated by black arrowhead, then returns warm water to chilled water return (52) demarcated by white arrowhead. The system (1) for heat removal from server racks, comprising of a mixing chamber (20) of a substantially rectangular frame, defined by a first major surface configured to attach or removably attach on a server cluster frame (10), wherein the first major surface receiving heat generated from the server racks, a second major surface configured to attach or removably attach on at least one heat removal cabinet (60), wherein the second major surface expelling the heat to the heat removal cabinets (60); impermeable top (21), bottom (25) and lateral surfaces (23) disposed adjacent to the major surfaces forming an enclosure of the chamber.

Referring to FIG. 4-A, there is shown a preferred embodiment heated air mixing chamber (20) coupled with impermeable top (21), lateral (23), and bottom surfaces (25), at least one partition assembly (24), and at least one diffuser (26). In FIG. 4-B shows an enlarged view of bottom portion of the preferred embodiment heated air mixing chamber (20).

In FIG. 4-C, there is shown an enlarged view of top portion of the preferred embodiment heated air mixing chamber (20). Then in FIG. 4-D, there is shown an enlarged view of the bottom portion of the preferred embodiment of actuator (210) to configure angle of diffusion ($\alpha,\beta$) of the diffuser (26). The partition assembly (24) has web structure (204) thereon, enabling heated air therethrough so that volume of the heated air is mixed homogenously and temperature of the heated air in the chamber approaches equilibrium. The partition assembly (24) coupled with an air diffusing means comprising at least one diffuser (26) mounted substantially vertical between guide plates (28). A pin (41) affixed each end of the diffuser on the guide plates, allowing the diffuser to be pivotable longitudinally. To enable effectively and efficiently diffuse the heated air, the diffuser (26) comprising web structure (206) can configure to manually or automatically pivotable to provide a diffusion angle ($\alpha,\beta$) with respect to the plane of the major surfaces. Further, the diffuser is operatively connected to an actuator (210) comprising actuation rod (211) or linkage, whereby upon an actuation or retraction of the rod or linkage to adjust the diffusion angle with respect to the plane of the major surfaces. Alternatively, the actuator (210) is operatively connected to a computer or controller (201) wherein the computer comprising executable programs receiving telemetry data from measuring instrument of working fluids, such as but not limited to, temperature, energy, pressure, mass flow rate, thereby instructing the actuators (210) to configure the diffusion angles ($\alpha,\beta$), respectively. Fluids are defined as liquid, gas, or a combination thereof; thus the working fluids in this regard are air, chilled water, and refrigerant.

In FIG. 5-A shows a perspective view of the present invention, a preferred embodiment system (1) of heat removal for server racks, with the outer and inner enclosures omitted exposing the heat removal cabinets (60). As explained in FIGS. 3-A and 3-B, the heat removal cabinet (60) may receive chilled water (51) to cool the heated air. However, water has less efficient heat transfer capability compare to refrigerants, such as chloroflurocarbons (CFC), hydrochlorofluorocarbons (HCFC), hydrofluorocarbons (HFC), and hydrocarbon (HC). Due to adverse effect of chlorine-based refrigerants which can deplete ozone layer and cause global warming, these refrigerants are no longer manufactured and are prohibited to use. Therefore, it is preferred that refrigerant with low ozone depleting potential and global warming potential is used. Here, the heat removal cabinets (60) acts as a refrigerant evaporator, a refrigerant/chilled water heat exchanger (59) acts as a refrigerant condenser, comprising two inlets and two outlets: receives chilled water supply (57); receives refrigerant vapor (72) from the heat removal cabinets (60), a heat transfer is taking place so that the refrigerant vapor is cooled or chilled until a refrigerant phase change to liquid then discharges the refrigerant liquid (71) back to the cabinets (60), and discharges water back to chilled water return (58). Accordingly in this embodiment, the refrigerant/chilled water heat exchanger (59) is installed relatively higher than the heat removal cabinets (60), as the refrigerant phase changes from vapor to liquid in the heat exchanger (59), the refrigerant liquid (71) is relatively heavy, can flow in a relatively small diameter pipe (demarcated by black arrowhead) to the cabinets by gravitational force, as the refrigerant liquid vaporizes (or phase change), the refrigerant's pressure increases. While the refrigerant vapor (72) is relatively light and buoyant, can flow in a relatively large diameter pipe (demarcated by white arrowhead).

Accordingly in this embodiment explains passive or "free" cooling, the condensation and vaporization of the refrigerant in the heat exchanger (59) do not require additional work-done or input power from refrigerant compressor or pump. Though it is envisaged that forced cooling which require refrigerant compressor or pump, expansion valve, hot-gas bypass and other ancillaries can be adapted or configured, if required, to suit for refrigerant of different thermodynamic properties. In FIG. 5-B shows a preferred embodiment heat removal cabinets (60) heat receiving side which abuts the mixing chamber, the heat receiving side comprising a web structure (62) or perforated door to allow heated air therethrough. The cabinet (60) may contain at least one heat exchanger (61) therein, the heat exchangers (61) can be coupled either (i) serially or (ii) in parallel shown in FIG. 5-C. It is envisaged that valves (56) such as flow valves, check valves, or the like, can be fitted in the parallel coupled heat exchangers so that not in used heat exchangers can be shut off, or prevent back flow of refrigerant vapor. As the refrigerant liquid (72) demarcated by a black arrowhead, enters heat exchanger inlet (55), heat transfer is taking place inside the heat exchanger, the refrigerant liquid phase changes to refrigerant vapor. Due to the buoyancy force in the refrigerant vapor, it exits through a heat exchanger outlet (54). A valve (53) is provided at the outlet (54) but prior to the chilled water return (71), mainly serves as a refrigerant flow control or can be shut off any heat removal cabinet (60) not in use. In FIG. 5-D shows the preferred embodiment heat removal cabinets fan-side. The heat removal cabinet (60) comprising at least one heat exchanger (61) therein, receiving a cooling fluid such as chilled water, refrigerant, air, or the like. The cooling fluid is configured at a volume flow rate, pressure, temperature, or a combination thereof, to cool the heated air by control valves, mass flow meter, energy meter, BTU meter, thermometer, or the like. The heat exchanger (61) is selected from one or more of the following types: fin, shell and tube, brazed plate, or the like, can has/have cross flow, counter flow, counter-current, or the like. The heat removal cabinet (60) combined with a plurality of fans (63) provides a substantial differential static pressure between the cabinet and ambient, driving the air flow across the heat exchanger between the cabinet and chamber.

Referring to FIG. 5-E, there is shown a schematic diagram of a preferred embodiment heat exchanger (59) interconnected by a chilled water/refrigerant heat exchange systems represented by one side of closed-loop chilled water system (81) and other side of closed-loop refrigerant system (82). As explained, the heat exchanger (59) serves as a refrigerant condenser and the heat exchanger (61) serves as a refrigerant evaporator. To enable sufficient amount of cooling capacity provided to the heat exchangers (59, 61), sensors are mounted on both systems (81, 82), such as but not limited to, insertion type or non-invasive (ultrasonic) type of thermometers, thermocouples, thermistors, or the like to provide telemetry data of water/refrigerant supply/return temperatures (211, 212, 213, 214), hot or cold aisle temperature (215), heat removal cabinet water/refrigerant temperature (217); mass flow rate meters, air flow velocities anemometer, air and liquid pressure gauges, BTU energy meter, or the like. These telemetry data are collected by the controller or computer (201) comprising executable programs and predetermined set values, so that it can configure a return chilled water valve (216) to fully open, partially open, or fully close.

Referring to FIG. 6-A, there is shown an exemplary data center arrangement comprising zones of server clusters and backup cooling unit for a data center. It has 4 zones, each zone has 3 clusters and 1 backup cooling unit. Each backup cooling unit has 4 air supply and 1 air return. Though this exemplary arrangement is for data center in a facility or building, it is envisaged that the present invention can be configured for a containerized data center.

FIG. 6-B shows an exemplary of a server cluster (demarcated by dotted line in FIG. 6-A and rotated by 90 degrees) running at 100% capacity and heat removal cabinets also running at 100% cooling capacity. As shown is one example, it has 2 rows of server racks. Each row has 10 units of server racks, 6 units of heat removal cabinets, of which 3 units are connected to 1 heat exchanger in an alternative fashion. There is a region, called staging chamber, whereby hot air is mixed homogenously before entering the heat removal cabinets. After heat removal module, cool air exits into a region called Kool-Corridor.

Scaling of Backup Cooling Unit

Each zone has 3 clusters and requires 1 backup cooling unit. As such, in a data center hall, the number of backup cooling unit required can be scaled according to the following:

$$N_{BCU} = \text{Integer}\left[\frac{N_{cluster}}{3}\right]$$

For example:
In a data center of 12 clusters of racks, the number of backup cooling units required are 12/3=4 units.

Cooling Redundancy Solution

The heat removal cabinets (60) of same row are arranged by alternating a number of the cabinets (N) and a vacant space. Furthermore, the vacant space enabling a redundancy higher than the number of cabinets, providing redundancy cooling capacity or backup cooling capacity.

For KoolLogix solution, it has two possibilities of cooling breakdown: heat removal module breakdown and heat exchanger breakdown. Backup cooling unit is of necessary when heat exchanger is breakdown. For cooling redundancy solution, it can be evaluated from energy balance perspective and can be referred to the following:

$$\text{Type of Cooling Redundancy Solution} = $$
$$N + \frac{\lfloor \text{Unit} \times \text{Cooling Capacity} \rfloor + \text{Ratio Cooling of } BCU - \text{Heating Capacity}}{\text{Cooling Capacity}}$$

Type 1: Heat Removal Module Breakdown

Example: Row Level

Cooling
Unit of Heat Removal Module: 5+1
Cooling Capacity of Heat Removal Module: 16 kW
Backup Cooling Unit: 0
Heating
Heating Capacity: 80 kW $$\text{Type of Cooling Redundancy Solution} = $$
$$N + \frac{\lfloor (5+1) \times 16 \text{ kW} \rfloor + 0 - 80 \text{ kW}}{16 \text{ kW}} = N + 1 \text{ Solution}$$

Example: Cluster Level

Cooling
Unit of Heat Removal Module: (5+1)×2
Cooling Capacity of Heat Removal Module: 16 kW
Backup Cooling Unit: 0
Heating
Heating Capacity: 160 kW $$\text{Type of Cooling Redundancy Solution} = $$
$$N + \frac{\lfloor (5+1) \times 2 \times 16 \text{ kW} \rfloor + 0 - 160 \text{ kW}}{16 \text{ kW}} = N + 2 \text{ Solution}$$

Type 2: Heat Exchanger Breakdown

Example: Cluster Level

Cooling
Unit of Heat Exchanger: 2
Cooling Capacity of Heat Exchanger: 96 kW
Backup Cooling Unit: 130 kW/2=65 kW
Heating
Heating Capacity: 160 kW $$\text{Type of Cooling Redundancy Solution} = $$
$$N + \frac{\lfloor 2 \times 96 \text{ kW} \rfloor + 65 \text{ kW} - 160 \text{ kW}}{96 \text{ kW}} = N + 1 \text{ Solution}$$

Example: Zone Level

Cooling
Unit of Heat Removal Module: 2×3
Cooling Capacity of Heat Exchanger: 96 kW
Backup Cooling Unit: 130 kW
Heating
Heating Capacity: 480 kW $$\text{Type of Cooling Redundancy Solution} = $$
$$N + \frac{\lfloor (2 \times 3) \times 96 \text{ kW} \rfloor + 130 \text{ kW} - 480 \text{ kW}}{96 \text{ kW}} = N + 2 \text{ Solution}$$

While the present invention has been shown and described herein in what are considered to be the preferred embodiments thereof, illustrating the results and advantages over the prior art obtained through the present invention, the invention is not limited to those specific embodiments. Thus, the forms of the invention shown and described herein are to be taken as illustrative only and other embodiments may be selected without departing from the scope of the present invention, as set forth in the claims appended hereto.

What is claimed is:

1. A system for heat removal from server racks, comprising:
   a mixing chamber of a substantially rectangular frame; and
   at least one heat removal cabinet,
      wherein the mixing chamber is defined by:
      a first major surface partitioned to have multiple first spaces,
         wherein each first space is configured to attach or removably attach a server rack or an outer enclosure,
         at least one first space attaches or removably attaches a server rack, and
         the first major surface is configured to receive heated air coming from the server rack;
      a second major surface partitioned to have multiple second spaces,
         wherein each second space is configured to attach or removably attach the at least one heat removal cabinet or an inner enclosure,
         at least one second space attaches or removably attaches the at least one heat removal cabinet, and
         the second major surface is configured to expel heat to the at least one heat removal cabinet; and
      an impermeable top, bottom and lateral surfaces disposed adjacent to the first and the second major surfaces, forming an enclosure of the mixing chamber;
      wherein
         the first major surface is partitioned into the multiple first spaces by a plurality of first partition assemblies, each matching to a width and a height of the server rack or the outer enclosure,
         wherein the first partition assemblies are configured to attach or removably attach the server rack or the outer enclosure,
         the second major surface is partitioned into the multiple second spaces by a plurality of second partition assemblies, each matching to a width and a height of the heat removal cabinet or the inner enclosure,
         wherein the second partition assemblies are configured to attach or removably attach the heat removal cabinet or the inner enclosure, and
         when each of the first partition assemblies receives either the server rack or the outer enclosure and each of the second partition assemblies receives either the heat removal cabinet or the inner enclosure, the mixing chamber forms an enclosed chamber, and
         the heat generated from each server rack mix inside the mixing chamber and achieve temperature equilibrium before being expelled.

2. The system for heat removal from server racks according to claim 1, wherein the first and the second partition assemblies are permeable to air, enabling heated air therethrough so that a volume of the heated air is mixed homogenously and a temperature of the heated air in the mixing chamber approaches equilibrium.

3. The system for heat removal from server racks according to claim 1, wherein the first and the second partition assemblies further comprise
   an air diffusing means and
   guide plates,
      wherein the guide plates are attached to the impermeable top surface and the impermeable bottom surface facing inside of the mixing chamber, and
      the air diffusing means comprises at least one diffuser mounted substantially vertical between the guide plates.

4. The system for heat removal from server racks according to claim 3, wherein the diffuser is permeable to air.

5. The system for heat removal from server racks according to claim 4, wherein the diffuser is manually or automatically pivotable to provide a diffusion angle ($\alpha,\beta$), which is an angle of the diffuser with respect to the plane of the first and second major surfaces.

6. The system for heat removal from server racks according to claim 5, further comprising an actuator having an actuation rod or linkage,
   wherein the diffuser is operatively connected to the actuator, and upon actuation or retraction of the actuation rod or linkage, the actuator adjusts the diffusion angle with respect to the plane of the first and the second major surfaces.

7. The system for heat removal from server racks according to claim 6, further comprising a computer or a controller that runs a program,
   wherein the actuator is operatively connected to the computer or the controller, and
   the program is configured for receiving telemetry data from one or more measuring instruments of temperature, energy, pressure, and mass flow rate, and for instructing the diffuser to adjust the diffusion angle.

8. The system for heat removal from server racks according to claim 1, further comprising at least one heat exchanger receiving a cooling fluid.

9. The system for heat removal from server racks according to claim 8, wherein a volume flow rate, pressure, temperature, or a combination thereof of the cooling fluid is controlled to cool the heated air.

10. The system for heat removal from server racks according to claim 8, wherein the heat exchanger is one or more types selected from the group consisting of fin, shell and tube, brazed plate, cross flow, counter flow, and counter current flow.

11. The system for heat removal from server racks according to claim 8, wherein the cooling fluid is chilled water, refrigerant, or air.

12. The system for heat removal from server racks according to claim 1, wherein the heat removal cabinet comprises a plurality of fans providing a differential static pressure between the heat removal cabinet and ambient, and a differential static pressure between the heat removal cabinet and the mixing chamber.

13. The system for heat removal from server racks according to claim 1,
   wherein a number of heat removal cabinets is two or more, and
   the heat removal cabinets of a same row are arranged by alternating the heat removal cabinets and a vacant space.

14. The system for heat removal from server racks according to claim 13, wherein a total number of the heat removal cabinets is higher than a minimum number of cabinets required, thereby providing redundancy cooling capacity or backup cooling capacity.

* * * * *